United States Patent [19]

Koide et al.

[11] Patent Number: 4,901,550
[45] Date of Patent: Feb. 20, 1990

[54] MANUFACTURING METHOD OF EXTRA FINE WIRE

[75] Inventors: Masato Koide, Iwaki; Takuro Iwamura, Omiya; Tsugio Koya, Urawa, all of Japan

[73] Assignee: Mitsubishi Kinzoku Kabushiki Kaisha, Tokyo, Japan

[21] Appl. No.: 291,009

[22] Filed: Dec. 28, 1988

[30] Foreign Application Priority Data

Dec. 28, 1987 [JP] Japan ................. 62-335842

[51] Int. Cl.⁴ .................................................. B21C 9/00
[52] U.S. Cl. ........................................ 72/38; 72/42; 72/280; 72/286
[58] Field of Search ............... 72/286, 280, 282, 278, 72/274, 42, 38

[56] References Cited

U.S. PATENT DOCUMENTS

| | | | |
|---|---|---|---|
| 1,008,808 | 11/1911 | Farkas | 72/38 |
| 2,165,056 | 7/1939 | Kalischer | 72/286 |
| 2,203,064 | 6/1940 | Schueler | 72/38 |
| 2,974,778 | 3/1961 | Ellis et al. | 72/286 |
| 3,826,690 | 7/1974 | Bleinberger | 72/286 |

FOREIGN PATENT DOCUMENTS

| | | | |
|---|---|---|---|
| 2931939 | 2/1981 | Fed. Rep. of Germany | 72/278 |
| 5417706 | 8/1972 | Japan . | |
| 515805 | 5/1976 | U.S.S.R. | 72/286 |
| 534812 | 11/1976 | U.S.S.R. | 72/42 |

Primary Examiner—Daniel C. Crane
Attorney, Agent, or Firm—Scully, Scott, Murphy & Presser

[57] ABSTRACT

In a method of manufacturing an extra fine wire, a blank wire cooled to a low temperature is caused to pass through a high humidity atmosphere and, immediately thereafter, is drawn to a diameter such that wire breakage due to the drawing does not occur. Alternatively, a blank wire is caused to pass through a die assembly so arranged as to be immersed in refrigerant, and is drawn within the refrigerant of low temperature, to a diameter with which wire breakage due to the drawing does not occur. The drawn wire material is heated rapidly and is annealed and, thereafter, is cooled rapidly to form an intermediate blank wire. Subsequently, the intermediate wire is drawn at the ordinary temperature.

12 Claims, 1 Drawing Sheet

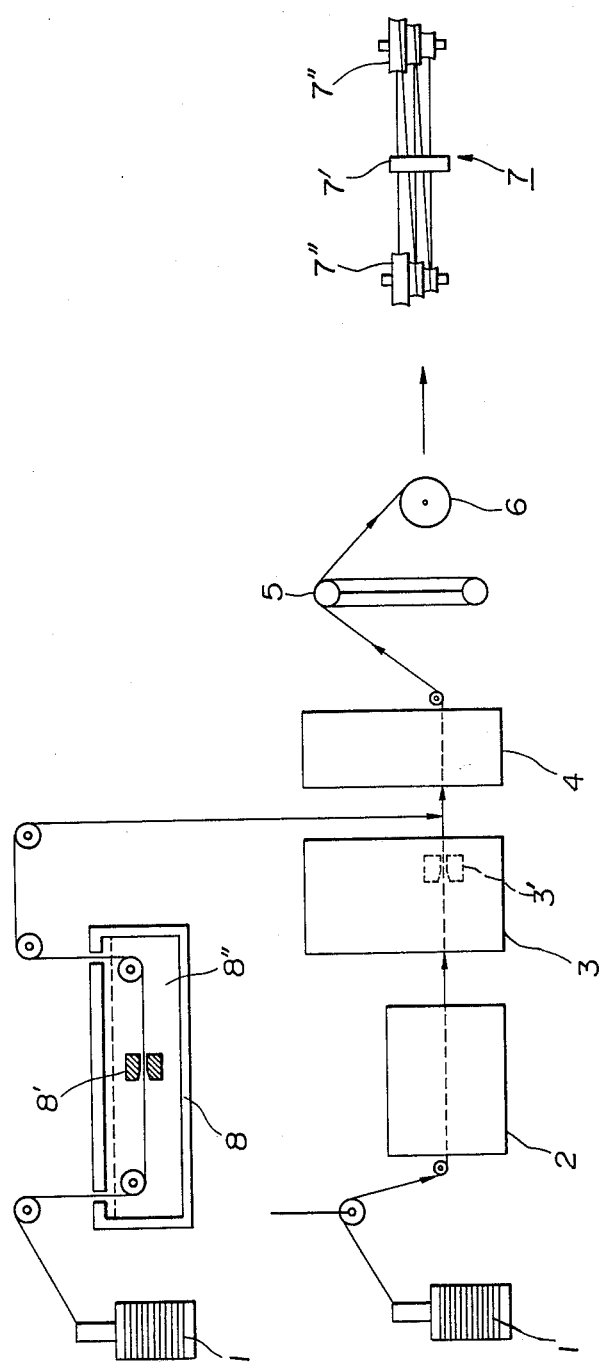

MANUFACTURING METHOD OF EXTRA FINE WIRE

BACKGROUND OF THE INVENTION

1. Field of the Invention

This invention relates to a method of manufacturing an extra fine wire capable of being used as an electronic lead wire, a bonding wire or a wire for extremely small magnets and, more particularly, to a method of obtaining an intermediate blank wire superior in drawing workability within an extra-fine-wire range, in which there is a reduced possibility of wire breakage even if the intermediate blank wire is drawn at ordinary temperatures. "Extra fine wire" is generally a wire equal to or less than 0.06 mm in diameter.

2. Prior Art

Methods of manufacturing an extra fine wire are known, which include (A) a method in which a drawing machine comprising multistage pulleys and a die assembly is employed to draw wire material continuously while spraying an appropriate amount of air-cooled lubricating oil, and (B) a method in which wire material is drawn while being immersed, together with a drawing die assembly, in low-temperature liquefied gas, as disclosed in Japanese Patent Publication (Kokoku) No. 54-17706.

The above-mentioned wire-drawing method (A) has the following problems. Because of frictional heat produced between the dies and the blank wire during the wire-drawing, the material strength of the blank wire is lowered due to dynamic recovery and recrystallization of the blank wire. In connection with this, the blank wire does not recover the ductility. When the blank wire, having repeatedly been drawn, is further drawn to an extra fine wire, equal to or less than 0.06 mm in diameter, breakage of the wire during drawing occurs frequently.

As described above, it is inevitable that using the above method (A) for drawing the blank wire into an extra fine wire at ordinary temperatures causes breakage of the wire to occur frequently. Because of this, the above-mentioned method (B) was developed for the purpose of obtaining an extra fine wire by processing within a low-temperature range which improves workability. However, method (B) requires a large refrigerant tank for accommodating therein the die assembly and the multistage pulleys, and also requires a great deal of cooling energy for cooling the entire system. Furthermore, it is impossible for method (B) to completely eliminate wire-breakage troubles during the production of extra fine wire. If wire breakage occurs, it takes a considerable time for inspection and repair. Thus, the method (B) cannot be said to be practical.

SUMMARY OF THE INVENTION

Because of the problems encountered using the above-mentioned methods (A) and (B), the inventors of this application have conducted researches and studies in an attempt to find ways to reduce wire breakage. As a result, the following knowledge has been obtained.

In a step prior to drawing an extra fine wire, a blank wire is drawn at a temperature which does not induce dynamic recovery and recrystallization within the structure of the wire material, thereby introducing work strain into the blank wire to the ultimate, to accumulate stored energy of the recovery and recrystallization. Subsequently, the drawn wire is heated rapidly and is annealed to produce a very large number of recrystallization nuclei. The wire is then cooled rapidly so as not to grain-grow these recrystallization nuclei, thereby forming extremely fine recrystallization grains to form an intermediate blank wire whose strength and ductility are increased. If such an intermediate blank wire is drawn into an extra fine wire by the above-mentioned conventional method (A), it is possible to drastically reduce breakage of the wire during the drawing thereof.

BRIEF DESCRIPTION OF THE DRAWING

The single FIGURE is a diagrammatic view of a manufacturing system for an extra fine wire according to the invention.

DETAILED DESCRIPTION OF THE INVENTION

The method for manufacturing an extra fine wire, in accordance with an embodiment of the present invention, comprises the steps of:

(a) cooling a blank wire having a diameter within a range of from 0.9 to 0.15 mm to a low temperature within the range $-200°$ C. to $-23°$ C., by the use of a refrigerant such as liquid nitrogen, dry ice and alcohol, or the like, and drawing the blank wire to a diameter within the range 0.30 to 0.10 mm, at which diameter wire breakage due to the drawing does not occur;

(b) heating the drawn blank wire rapidly to an annealing temperature within the range $200°$ C. to $600°$ C. at a heating rate equal to or above $1000°$ C./sec and, thereafter, cooling the heated wire rapidly at a cooling rate equal to or above $50°$ C./sec, thereby obtaining an intermediate blank wire; and (c) cold-drawing the thus obtained intermediate blank wire to a final diameter equal to or less than 0.06 mm at ordinary temperatures.

In the step (a), the drawing may be carried out within the refrigerant, or may be effected after the cooling of the blank wire is completed. In the latter case, the blank wire, cooled to the low temperature, may be caused to pass through a high humidity atmosphere having a humidity equal to or above 70%. With this additional procedure, water vapor is dew-formed or frozen onto the surface of the blank wire, and lubricity is improved.

The reasons why the numerical values of the various conditions are limited to those mentioned above will be hereinafter described.

(1) Blank Wire Diameter

Having the diameter of the blank wire larger than 0.9 mm results in an increase in the number of working steps of wire drawing at low temperature, and is not acceptable from an industrial point of view. On the other hand, if the blank wire diameter is less than 0.15 mm, a sufficient forming rate cannot be achieved. Accordingly, the blank wire diameter was limited to the range of from 0.9 to 0.15 mm.

(2) Low Temperature

The low temperature is within the range of $-200°$ C. to $-23°$ C. In order to bring the temperature to a value less than $-200°$ C., liquid helium is required. This is expensive and not cost-effective industrially. On the other hand, if the temperature is raised beyond $-23°$ C., it is impossible to accumulate sufficient low temperature strain. Accordingly, the low temperature was limited to the range −200° C. to −23° C.

(3) Humidity

The blank wire brought to low temperature is caused to pass through a high humidity atmosphere whose humidity is equal to or above 70%, to dew-form or freeze the water vapor onto the surface of the blank wire, for the purpose of improving the lubricity between the blank wire and the dies. Accordingly, the higher the humidity, the better. However, the dew formation or freezing sufficient to acquire the requisite degree of lubrication occurs relatively easily with humidity levels equal to or greater than 70%. Thus, the humidity was determined to the value equal to or higher than 70%.

(4) At Which No Breakage Occurs

The situation may arise where the drawing of the blank wire at low temperature is carried out within a refrigerant such as liquid nitrogen, dry ice and alcohol, or the like. If the blank wire is broken whilst being drawn within the refrigerant, much time and much labor are required for the repair. Accordingly, the blank wire is required to have a diameter such that wire breakage will not occur within the refrigerant. If the wire diameter is less than 0.10 mm, breakage of the wire occurs during the drawing. If the wire diameter is larger than 0.30 mm, however, the forming rate at the processing of the extra fine wire becomes excessive. Thus, the wire diameter after the drawing at low temperature needs to be in the range 0.30 to 0.10 mm.

(5) Annealing Temperature

If the annealing temperature is lower than 200° C., effective recrystallization cannot be obtained within the structure of the wire. On the other hand, if the annealing temperature is higher than 600° C., the crystal grains are coarsened so that the wire breakage rate during the drawing of the extra fine wire is increased. Accordingly, the annealing temperature was limited to a range of 200° C. to 600° C.

(6) Heating Rate And Cooling Rate

If the heating rate to the above-mentioned annealing temperature is lower than 1000° C./sec, the fine recrystallization grains are not effectively produced. On the other hand, if the cooling rate is less than 50° C./sec, it is impossible to prevent growth of the fine recrystallization grains. Accordingly, the necessary heating and cooling rates have been determined, respectively, at a value equal to or higher than 1000° C./sec and a value equal to or higher than 50° C./sec.

The invention will now be illustrated by the following examples.

EXAMPLES

Referring to the FIGURE, there is shown diagrammatically a system for manufacturing an extra fine wire according to the invention. The following components were prepared for the manufacturing system:
- a blank wire 1 formed of tough pitch copper having a diameter of 0.18 mm and wound into a coil;
- a low-temperature box 2 maintained at a temperature of −100° C.;
- a continuous drawing machine 3 provided with a humidity adjusting device capable of controlling the temperature of a die assembly 3′ in a range of from −10° C. to 10° C. and capable of controlling the humidity of the atmosphere to a value equal to or higher than 70%;
- a continuous electric annealing device 4 capable of adjusting the heating rate to a value equal to or higher than 1000° C./sec and an annealing temperature to a value within the range 200° C. to 600° C.;
- an air-cooling device 5 capable of achieving a cooling rate equal to or higher than 50° C./sec;
- a take-up device 6 for an intermediate blank wire;
- a drawing device 7 having multistage pulleys 7″ and a die assembly 7′; and
- a refrigerant tank 8 filled with refrigerant 8″ and having accommodated therein a die assembly 8′.

The components prepared as above were assembled into the manufacturing system as shown in the FIGURE in such a manner that the blank wire 1 was transported in the direction indicated by the arrows.

An extra fine wire was manufactured in the following first and second ways (I) and (II).

First Way (I)

The blank wire 1 formed of tough pitch copper of 0.18 mm in diameter and wound into a coil was caused to pass through the low-temperature box 2 which was maintained at a temperature of −100° C., to cool the blank wire 1 such that the temperature of the blank wire 1 discharged through an outlet of the low-temperature box 2 was brought to about 70° C.

The blank wire 1, cooled to about 70° C., was caused to pass through the high humidity atmosphere (95%) of the drawing machine 3, to deposit adequate fine frost or ice to serve as lubricant, onto the surface of the blank wire 1. At the same time, the blank wire 1 was caused to pass through the die assembly 3′ whose temperature was maintained at 0° C., at the drawing rate of 1000 m/min, to draw the blank wire 1 to a diameter of 0.12 mm.

The blank wire 1 drawn to a diameter of 0.12 mm was electrically heated at a rate of about 3000° C./sec, and was annealed under conditions such that the maximum temperature reached was within the range 480° C. to 530° C. and the total heating time was 1/30 second. The blank wire 1 was then caused to pass through the cooling device 5 where the blank wire 1 was cooled at a rate of about 800° C./sec. Subsequently, the wire was wound up by the take-up device 6 to form an intermediate blank wire.

The intermediate blank wire was drawn continuously by the conventional drawing device 7 comprising the multistage pulleys 7″ and the die assembly 7′, while an appropriate amount of air-cooled lubricating oil was sprayed onto the intermediate blank wire, to manufacture three types of extra fine wires whose respective diameters were 0.03 mm, 0.02 mm and 0.01 mm. At this time, a wire breakage rate was measured, which is a number of wire breakages during the time 10 Kg of blank wire is drawn and which is expressed by the number of wire breakages/10 Kg-drawing. In this manner, the wire breakage rate of the invention was obtained.

Also, the blank wire 1 formed of tough pitch copper having a diameter of 0.18 mm was cold-drawn to a diameter of 0.12 mm by the use of the die assembly. Subsequently, electric annealing was applied to the drawn blank wire in a manner like that described above, to form a conventional intermediate blank wire. The conventional intermediate blank wire was drawn by the above-mentioned known drawing device 7 composed of the multistage pulleys 7'' and the die assembly 7', to form three types of extra fine wires whose respective diameters were 0.03 mm, 0.02 mm and 0.01 mm. The wire breakage rate this time was measured as that for conventional methods.

The measurement results of the wire breakage rates are set forth in Table 1.

TABLE 1

| Extra Fine Wire Diameter | Wire Breakage Rate (Number of breakages/10 Kg-drawing) | |
|---|---|---|
| | Prior Art | Invention |
| 0.03 mm | 3–5 | 0–1 |
| 0.02 mm | 8–10 | 1–2 |
| 0.01 mm | 45–80 | 4–5 |

Second Way (II)

As shown in the FIGURE, a blank wire 1 wound into a coil and formed of tough pitch copper of 0.18 mm in diameter was drawn by the die assembly 8' arranged within the refrigerant tank 8 filled with a refrigerant 8'' of liquid nitrogen, to obtain a blank wire whose diameter was 0.12 mm.

The blank wire of 0.12 mm in diameter was subjected to heat treatments including rapid heating, annealing and cooling under the same conditions as those of the previous first way (I). The blank wire was then wound up by the take-up device 6 to form an intermediate blank wire.

The intermediate blank wire was formed, under the same conditions as those of the above-mentioned first way (I), into three types of extra fine wires whose diameters were 0.03 mm, 0.02 mm and 0.01 mm, respectively. A wire breakage rate at this time, which is expressed by the number of breakages/10 Kg-drawing, was measured.

The results obtained were substantially the same as those of the previous first way (I).

In the above-described first and second ways (I) and (II), the blank wire formed of tough pitch copper is employed to put the extra-fine-wire manufacturing method of this invention, into practice. It should be noted, however, that the blank wire material is not limited to tough pitch copper, the invention being equally applicable to the manufacture of an extra fine wire formed of copper alloy, pure aluminum or low-aluminum alloy.

As will clearly be seen from Table 1, the method of manufacturing an extra fine wire according to the invention has the following advantages: it is possible to reduce the wire breakage rate (the number of breakages during drawing of 10 Kg of wire material) considerably compared with conventional methods, so that the yield can be improved or enhanced; the drawing of the wire into extra fine wire, with which breakages occur frequently, can be carried out at ordinary temperatures, making it possible to facilitate inspection and repair at the wire breakage; and, during the drawing of the intermediate blank wire, frost or ice is deposited onto the surface of the blank wire to improve the lubricity, thereby preventing generation of frictional heat during the drawing, so that no lubricating oil is required.

What is claimed is:

1. A method of manufacturing an extra fine wire, comprising the steps of:
   (a) cooling a blank wire to a low temperature and passing said cooled wire through a high humidity atmosphere so that the low temperature imparted to the wire and the high humidity atmosphere cause a water coating to be formed on the wire, and subsequently drawing said blank wire to a diameter such that wire breakage due to the drawing does not occur;
   (b) heating the drawn blank wire rapidly to anneal the same and, thereafter, cooling the blank wire rapidly to form an intermediate blank wire; and
   (c) thereafter, drawing said intermediate blank wire at a ordinary temperature.

2. A method according to claim 1, wherein said high humidity atmosphere has a humidity of at least 70%.

3. A method according to claim 2, wherein, in said step (a), said blank wire is cooled by the use of refrigerant.

4. A method of manufacturing an extra fine wire comprising the steps of:
   (a) cooling a blank wire to a low temperature and passing said blank wire through a drawing die assembly immersed in refrigerant, and drawing said blank wire to a diameter such that wire breakage due to the drawing does not occur;
   (b) heating the drawn wire rapidly to anneal the same and, thereafter, cooling the blank wire rapidly to form an intermediate blank wire; and
   (c) thereafter, drawing said intermediate blank wire at a ordinary temperature.

5. A method according to claim 3 or claim 4, wherein, in said step (a), said blank wire is cooled to said low temperature which is within a range of from −200° C. to −23° C.

6. A method according to claim 5, wherein said diameter such that wire breakage does not occur is within a range of from 0.30 to 0.10 mm.

7. A method according to claim 6, wherein said drawn blank wire is annealed at a temperature within a range of from 200° C. to 600° C.

8. A method according to claim 7, wherein said drawn blank wire is heated rapidly at a heating rate of at least 1000° C./sec.

9. A method according to claim 8, wherein said drawn blank wire is cooled at a cooling rate of at least 50° C./sec.

10. A method according to claim 9, wherein said blank wire before the drawing in said step (a) has a diameter within a range of from 0.9 to 0.15 mm.

11. A method according to claim 10 wherein said refrigerant is one of liquid nitrogen, or dry ice and alcohol.

12. A method according to claim 11, wherein said intermediate blank wire is drawn to a final diameter of at most 0.06 mm.

* * * * *

UNITED STATES PATENT AND TRADEMARK OFFICE
CERTIFICATE OF CORRECTION

PATENT NO. : 4,901,550

DATED : February 20, 1990

INVENTOR(S) : Koide Masato, et al.

It is certified that error appears in the above-identified patent and that said Letters Patent is hereby corrected as shown below:

Column 3, line 17: "At Which No Breaking Occurs" should read as --Wire Diameter At Which No Breakage Occurs--

Signed and Sealed this

Ninth Day of July, 1991

Attest:

HARRY F. MANBECK, JR.

Attesting Officer

Commissioner of Patents and Trademarks